United States Patent [19]

Blight

[11] 4,218,799
[45] Aug. 26, 1980

[54] WASH-OUT APPARATUS FOR PRINTING MACHINES

[75] Inventor: Langdon R. Blight, Millswood, Australia

[73] Assignee: Alison M. Blight, Millswood, Australia

[21] Appl. No.: 17,891

[22] Filed: Mar. 6, 1979

[30] Foreign Application Priority Data

Mar. 7, 1978 [AU] Australia ............................. 361678
Jul. 11, 1978 [AU] Australia ............................. 503278
Nov. 27, 1978 [AU] Australia ............................. 691278

[51] Int. Cl.² .......................................... A46B 11/00
[52] U.S. Cl. ............................................... 15/77
[58] Field of Search ......................... 15/77, 102; 134/6

[56] References Cited

U.S. PATENT DOCUMENTS

| | | | |
|---|---|---|---|
| 3,761,984 | 10/1973 | Hauschild | 15/77 X |
| 4,023,229 | 5/1977 | Blight | 15/77 |
| 4,138,755 | 2/1979 | Hashimoto et al. | 15/77 |
| 4,148,108 | 4/1979 | Kamata et al. | 15/77 |

FOREIGN PATENT DOCUMENTS 146894 6/1952 Australia ................................. 15/102

Primary Examiner—Edward L. Roberts
Attorney, Agent, or Firm—Pearne, Gordon, Sessions

[57] ABSTRACT

A flat plate wash out machine especially suitable for joint brushing and solvent action on photopolymer printing plates in which brushing fingers are held by a pliable sheet with distributed pressure means behind the pliable sheet and the solvent is held in a container so that any photopolymer plates can be held substantially vertical during any wash out procedure. Mechanical agitation is achieved by a simple to and fro action of a pneumatic ram and two containers with perhaps differing solvents can be used at the same time with the same pneumatic ram driving.

13 Claims, 14 Drawing Figures

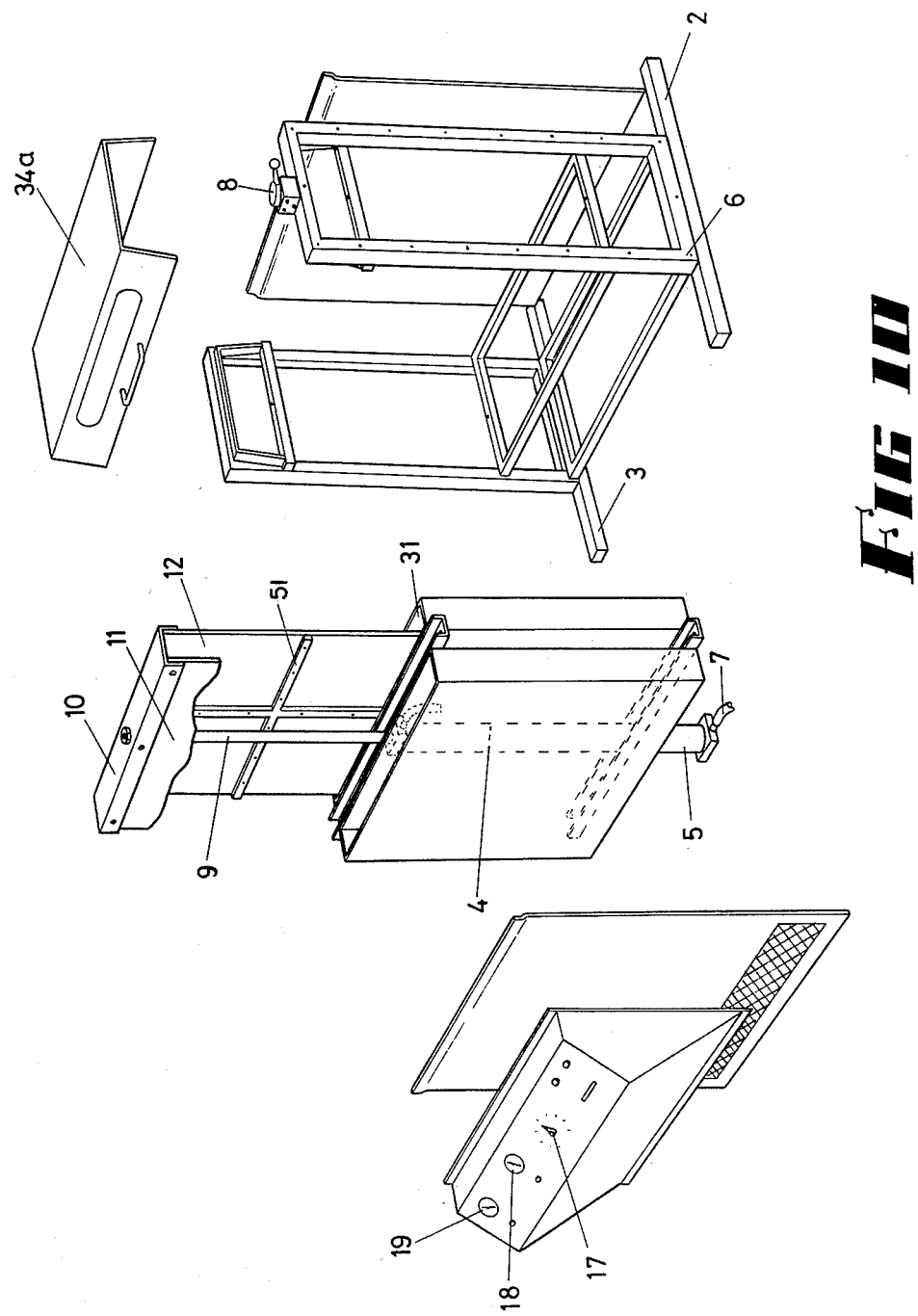

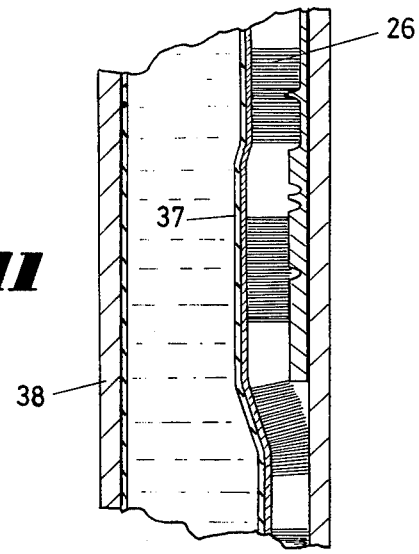
FIG 11
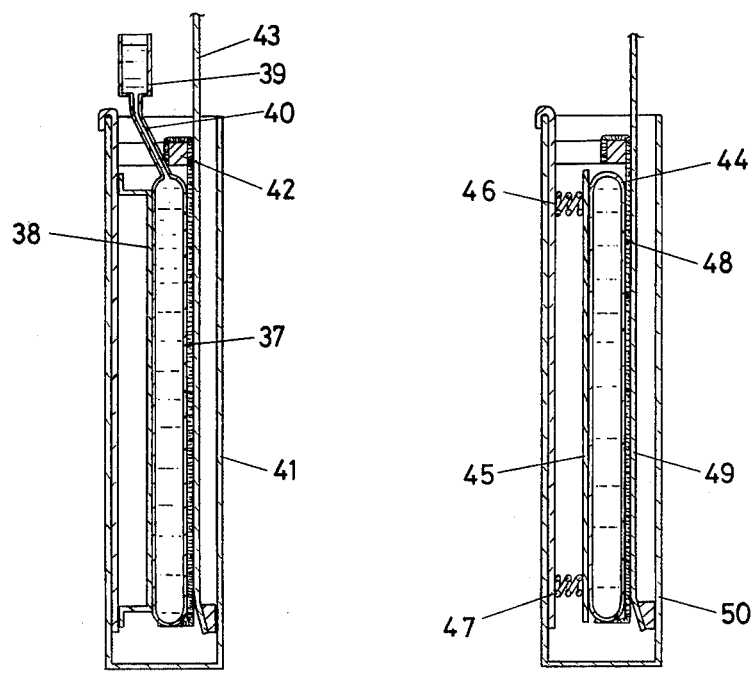
FIG 12  FIG 13

WASH-OUT APPARATUS FOR PRINTING MACHINES

This invention relates to flat plate wash out apparatus where the flat plates are of a type that can be useful for printing applications.

BACKGROUND OF THE INVENTION

As illustrative of the prior art, reference can be made to the previous U.S. Pat. No. 4,023,229 dated May 17, 1977 in the name of Langdon Ross Blight and Alison Mary Blight.

This patent resulting in significant improvements in both the cost of manufacture of apparatus for washing out of plates and also in results obtainable in relation to the plates so washed out with the machine.

Significant problems still remain in relation to the overall design of such machines, especially when they are expected to handle plates of differing types, where for instance, the solvent material is extremely volatile, expensive, and toxic.

The machine previously described in my earlier Patent solved some of the problems, especially the danger of having electric switches and other dangers of electric sparking in close vicinity to the high vapour content, but there is the further problem that must be faced, namely that in the wash out of some plates, the cost of the solvent in itself becomes a very high operating expense simple because of the evaporation of this material aggravated by the nature of the mechanical action over the face of the material, and there is then the second problem that the vapours are generally considered toxic or in the very least, having effects on workers exposed to these fumes, the long term effects of which are simply not able to be forecast.

In other types of wash out apparatus, such as one in which the solvent is sprayed under high pressure jets at the plate, the problem is even more aggravated because of the high vapourization this spraying action will cause on the solvent.

There is a further problem in relation to present techniques for washing out these plates especially with this mechanical agitation, namely that the action must be such as to promote the removal of the unwanted material in a minimal time.

It must also achieve this with the highest degree of distinction between the unwanted and wanted material, so as not to in any way damage or unnecessarily remove some of the wanted material.

In other words, the mechanical action just cannot be that severe, and as will be seen from my previous Patent, the technique of mechanical agitation is very important but also a problem.

The problem comes from the difficulty of being able to ensure that any mechanical member for instance, a brush fibre is used in such a way and under such controlled pressure that even the finest projections on for instance, a printing plate, will not be inadvertently removed by undue pressure at any location on the plate.

The problem is to have such action uniform over a large plate area where the plate area may comprise separate segments which are separated by quite deep channels and which may have significantly higher or lower faces.

Furthermore, taking perhaps a brush face, having conventional bristles, differences in length of very small dimensions in relation to one bristle as compared to another are very difficult to achieve in practice, but unless almost negligible difference is achieved, where the brush is supported by a single fixed backing, then there will be significant differences in pressure applied over localized areas, and this will have a quite different result, area to area in the wash out action.

This will mean that some parts will become overwashed out or of course other parts can become under washed out in a given time, which results in printing plates perhaps of the photopolymer type which are not of good standard or perhaps more correctly put, of a standard that can preferably be reached.

OBJECTS OF THIS INVENTION

Some objects of this invention which relate to improvements in general terms to apparatus suitable for this application, include the object of providing a flat plate wash out apparatus which can be used with very highly volatile solvents and which will offer an adequate wash out effect without promoting as much vapourization as has hitherto been the case of the solvent, or assists in providing means by which such vapourization can be minimised.

It is further object that the means providing the mechanical agitation during the wash out action can achieve an action which is more uniform than has hitherto been the case, and such can be achieved in an economic and practical manner, and moreover, can be achieved in such a way that it facilitates also the minimization of vapourization.

A further object of this invention is to provide drive means for effecting the mechanical movement of the wash out members which firstly still maintain the advantages of not promoting any electrical sparking therefore, providing any hazard but at the same time, secondarily, providing in economic and practical manner a drive action that is both effective for good wash out and incidentally, can be used for additional support in access to portions of the machines.

A further object of this invention is to propose a machine which can in economical manner and in such a way as to take a minimum of floor space, handle, in as quick a time as possible, the washing out of plates in an adequate way and especially provide that plates requiring different solvents may be in an economical way be able to be handled with wash out at the same time with the same machine.

It is to be noted that the objects here may relate either to a main feature or to subsidiary features of the invention and all are not expected to be achieved by any broadest concept of the invention as expressed in claims appended hereto.

CONCEPT OF THE INVENTION

In one form of the invention, it could be said to reside in a flat plate wash out apparatus of a type including a container for holding solvent fluid, a holder within the container to hold a flat plate for washing out purposes, with face portions to be selectively removed under the joint actions of the solvent within the container and a mechanical scouring action, brush means held adjacent the flat plate face location, and means adapted to provide relative movement between any flat plate held within the container and the brush means to effect the said scouring action, the apparatus being characterized according to this invention in that the brush means include a pliable sheet located behind brush out fingers projecting toward the face of a flat plate when held appropriately in the holder, and distributed pressure means behind the said pliable sheet to provide substantially uniform pressure against the pliable sheet.

There are of course means also to keep the pliable sheet in the location stated, and such means merely retaining the pliable sheet which is in itself subject to pressure from behind will cause tension across the pliable sheet, which does assist in transmitting pressure more uniformly across the sheet.

The tension can be caused then by simply holding the sheet and allowing the pressure from behind to apply the pressure or additional spring means to apply tension to hold the pliable sheet in position.

While there are significant advantages in this arrangement, from several points of view, it generally reduces or totally removes a problem that has hitherto been faced in this art, which can be termed "tipping".

If one supports a number of independent brush elements each with their independent spring support over the whole face, this would of course provide a much more uniformly distributed pressure in relation to the brush elements, but herein lies the problem, namely that the smaller the element, the more one side is liable to be caught and be pushed or tipped as compared to the other side, so resulting in a non-uniform pressure which results in a non-uniform washing out action.

Mechanical answers hitherto proposed have either provided such complications or difficulties in relation to either, to reliability of action or costs of manufacture, that they have generally not been considered totally feasible and therefore an effective answer.

The use of a "pliable" sheet, that is a sheet which will have no significant resilient reaction when deflected in a direction transverse to its planar position, ensures that the pressure is in effect applied by the numerous spring elements or distributed spring pressure or distributed resilient pressure behind the pliable sheet, and the pliable sheet protects these elements from this tipping effect.

A quite significant aspect of this feature, is that it does facilitate a further feature which shall now be described.

Rather than considering different types of plates or different solvents, it is now proposed according to this invention that the flat plate holding means are adapted to hold a flat plate which the plane of the plate in a vertical or substantially vertical orientation while being within solvent held within a container and the appropriate wash out mechanism is accordingly adapted to be effective while the flat plate is in such orientation.

The improvements achieved by such a rearrangement of orientation especially facilitated with the pliable sheet arrangement and especially with subsequently described improvements in drive means, have provided very significant advantages.

Because, for instance, most of the agitation will be deep within any solvent, the surface of any solvent fluid will be substantially without significant agitation or at least minimal agitation, and of couse the surface area in itself is significantly reduced as compared to horizontal layouts.

It immediately becomes a proposition then, to provide a second fluid which will not readily mix with the solvent and which can then be lighter in density than the solvent and which therefore when poured on the top of the solvent in the container, will stay on this and will in effect act as a retarder to any evaporation of the basic solvent material.

This has hitherto been so difficult because any surface material will be so agitated that it becomes in effect a suspended emulsion or other mixture with the solvent, and can impede the action of the solvent as such or is otherwise rendered useless.

The vertical orientation concept therefore, provides significant advantages that have hitherto not been available and in fact completely change much of the problems and the viability of machines of this type.

The concept of verticallity is in itself a feature which can stand alone, and which can be used, albeit with less advantage with other methods of providing pressure but the present pliable sheet technique provides varied advantageous methods of applying the pressure and especially provides means whereby many of the problems that have hitherto been thought might occur, can be avoided.

In another form then, the invention can be said to reside in a flat plate wash out apparatus of a type which includes a container for holding solvent fluid, and drive means to effect a relative wash out movement between a plate held in plate holding means and brush means, while the plate is within solvent fluid held in a container, the apparatus being characterized in that the plate holding means are adapted to hold any flat plate, in a position in solvent fluid in the container, in a substantially vertical orientation while being subject to wash out action from the brush means.

Preferably, the apparatus is further characterised in that drive means effecting relative wash out movement include a pneumatic or hydraulic ram, a supply of pneumatic or hydraulic fluid at an above atmospheric pressure, and valve means to control the supply of the said fluid to the ram upon a selection of valve positions, so as to effect a to and fro action which is, by coupling means, transferred to the plate holding means, so as to result in an upward and downward wash out movement relative to the brush means. Preferably the brush means, together with the pliable sheet that might be used, are together constituted by being a respective portions of plush.

In one preferred arrangement, the distributed pressure means behind the pliable sheet comprises sac having fluid therein under pressure whereby to cause the necessary uniform pressure against the pliable sheet.

According to a further preferred feature, the drive means include a rod, raised and lowered by the ram, and valve means selectable so that in one selected position, the rod being coupled to the plate holding means, will effect a lifting of such plate holding means, out from a position within the container, to assist in relocation of plates to be washed out.

A further preferable feature, the arrangement in which there are two containers for holding solvent fluid, and each includes means as hitherto characterized, the two containers being in an adjacent location, one to the other, and each drive means being effected by a common pneumatic or hydraulic drive ram.

DESCRIPTION OF PREFERRED EMBODIMENT

There are further features and combinations of features which together comprise significant advances in the art which shall be seen especially when the following description of several preferred embodiments is described.

The advantages of the various features or combinations will be especially apparent to those without detailed description of the actual advantages, familiar with this art.

To assist in a full understanding of this invention, reference shall now be made to several preferred embodiments which shall be described with the assistance of drawings in which:

FIG. 10 is an exploded view showing the various portions making up most of the preferred embodiment;

FIG. 11 shows in cross-section and in elevation a portion of the means for providing pressure according to a second preferred embodiment, especially showing the manner in which the pressure will be generally equal even though the plate will have significantly differing thickness portions;

FIG. 12 is a cross-sectional elevation showing in full detail the arrangement, the detail of which is shown in FIG. 11 and especially showing means to provide the head of fluid necessary to provide the additional fluid pressure to effect the upward pressure necessary to provide pressure by the plush against the plate;

Figure 14:
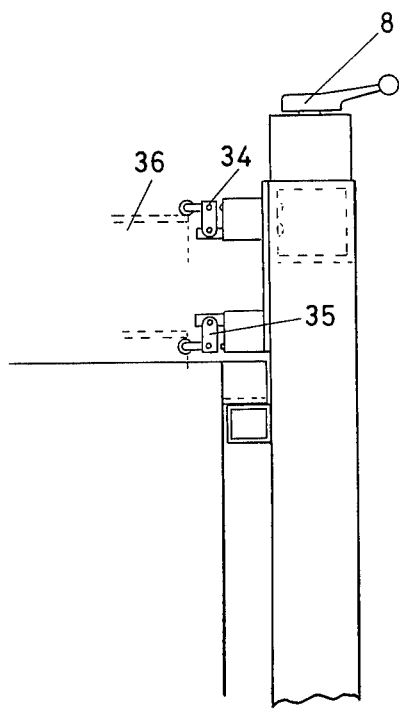

FIG. 13 is a side elevation of an arrangement shown generally schematically, this third preferred embodiment showing an arrangement in which there is an enclosed sac of fluid which is arranged to act to distribute pressure uniformly behind the plush, and the pressure applied to the sac is offered by resilient spring means acting through a plate; and FIG. 14 is a side elevation showing in more detail an upper trip valve and a lower trip valve arrangement controlling the operation of supply of air pressure for lifting and lowering of the plate holder through the operational cycle, this of course being according to the first preferred embodiment.

Now referring in detail to the drawings, and especially the first preferred embodiment, there is a housing 1 which includes feet 2 and 3 adapted to provide stable support for the housing 1 in the apparent vertical position as shown.

Within the housing is a centrally located pneumatically operable ram 4 which has a cylinder 5 supported at a lower end to a frame 6 of the housing and which has the supply of hydraulic fluid connected by a conduit 7 through control valve 8.

Control valve 8 is a three-way valve having three positions one being a wash out position, a second being a raised position and a third being a release position.

A piston within the hydraulic ram 4 is connected to piston rod 9 an upper end of which is secured to a plate holder support arm 10.

This arm 10 is in the form of a "U" shaped member in cross section and each of the legs of the "U" shape provide support for one or other of the plate holders 11 and 12.

Each plate holder comprises a metal sheet of appropriately anti-corrosive material such as stainless steel suitably reinforced by reinforcing packing bars 51.

There are provided on each of the plate holders, both 11 and 12 plate clamps 13 being the upper plate clamps, and 14 being the lower plate clamps and each of these can be opened by twisting of cam member 15 to allow for location of a plate such as a photopolymer plate therein, after which the cam is reorientated to allow the spring action of the plate clamp to take over and grab the appropriate end of the plate.

A control panel 16 includes a mechanical timer connected to the fluid pressure supply so that the time for the operation cycle can be preset and after which an audible signal can be given such as a bell.

The control for this is shown at 17, also there is shown a pressure indicator for indicating the pressure of the supply air for operating the pneumatic ram and the indicator 19 indicates the existing head of solvent within each container so as to warn if the level of solvent falls below a selected minimum. The means providing such indication are now shown in detail for sake of simplicity of the drawings, but are simply a float control with indicator mechanically coupled to the reading device.

The means to apply the scouring action and providing pressure for projecting fingers against any plate held by the plate holder are generally held on a separable assembly 20 which includes a frame 21 having outwardly projecting arms 22 which support through locating pins 23 a plush frame 24.

The plush frame comprises a rectangular frame constructed of square cross-section non-corrosive metal such as high quality stainless steel and has stretched across its opening area, plush which is secured by suitable cross bars and screws to the frame at an upper end 25 and at a lower end 26 thereof.

Figure 9:
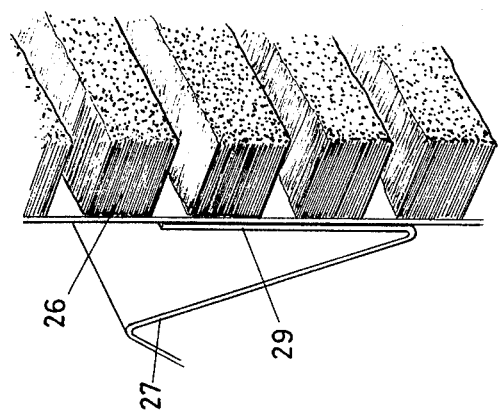
FIG. 9 is again a perspective view also of the preferred embodiment showing rather in large detail, the channelling used in a preferred arrangement in relation to the plush fibres.
Figure 8:
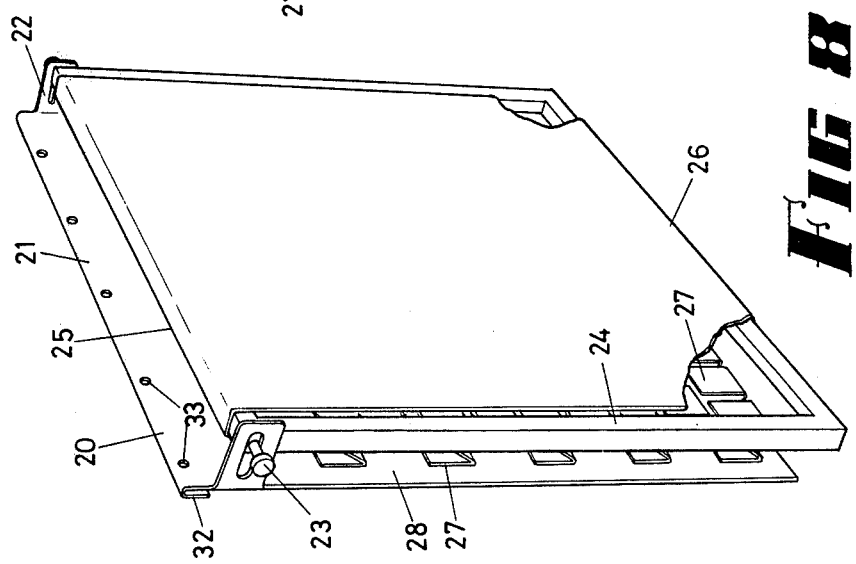
FIG. 8 is a perspective view of a portion of the apparatus once again of the preferred embodiment, this especially being the assembly holding the plush and the plurality of springs to provide the pressure behind the plush.

The term plush is a well known and accepted term within the art and comprises a number of outwardly projecting fingers which provide brush out means each of which are bound to a fabric base which provides a pliable sheet supporting overall the projecting fingers shown in FIG. 9 especially as 26.

It has been found to be of considerable advantage to provide channels in which the fibres are removed in parallel channels across the width of the plush throughout its height this assisting in providing channels to assist in removal of washed out material and access to solvent for the wash out action.

Behind the plush so supported on the frame 24 are a plurality of springs 27 each of these comprising a member constructed of sheet stainless steel and being bent into the form of a "W" having one leg secured to a backing plate 28 and of course having a forward leg 29 adjacently plush so as to provide an outward pressure against the plush.

Figure 7:
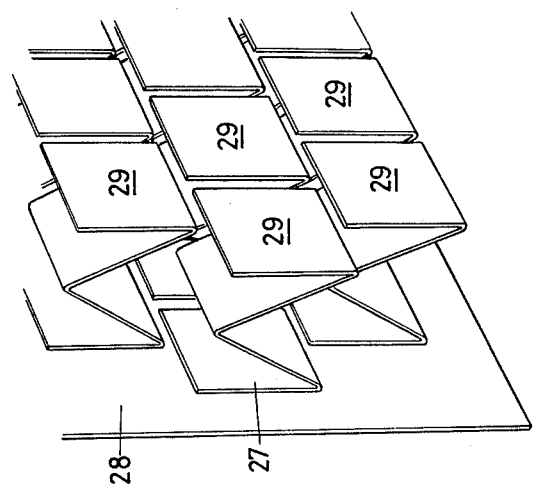
FIG. 7 is a perspective view once again, of a portion of the preferred embodiment showing the face of a plurality of adjacent springs arranged to provide pressure against the plush.

Each of the legs 29 are of rectangular proportions and are staggered in a brick face-like pattern and in adjacent relationship to the other plates 29 as is shown especially in FIG. 7.

The assembly 20 is duplicated, and there is one such assembly for each of the containers 30 and 31 and these are secured to the container by having an upper lip 32 fitting over the respective side wall of the respective container either 30 or 31.

The assembly 20 is secured in this position by having appropriate screws passing through apertures 33 into the appropriate side wall portion of the container.

A lid 34a covers both of the containers 30 and 31.

Figure 1:
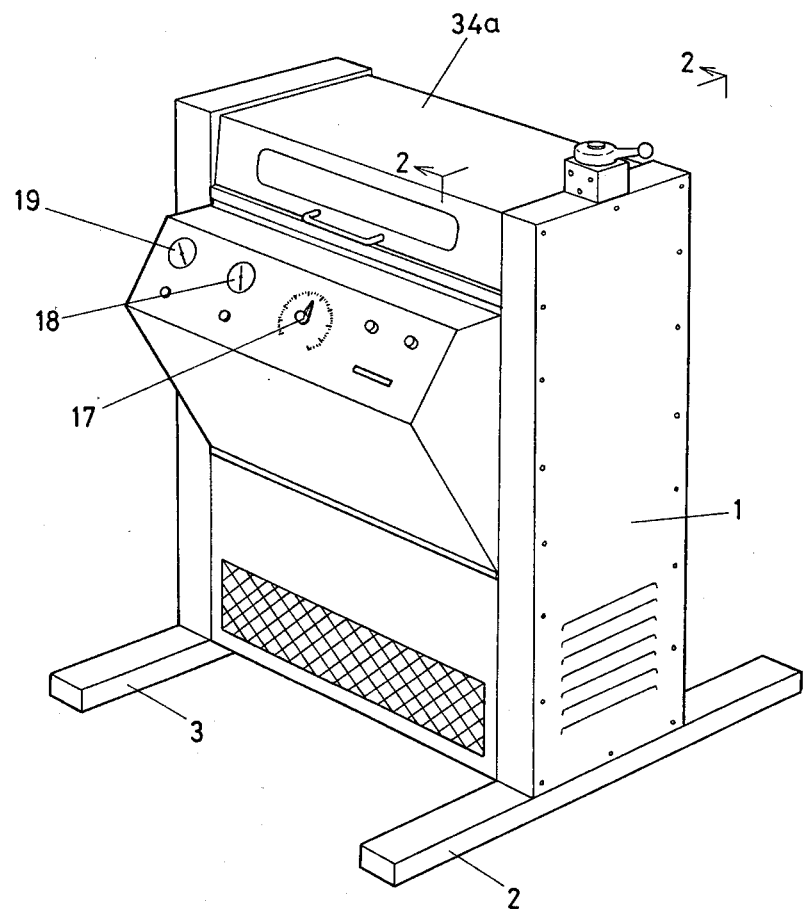
FIG. 1 is a perspective view of the exterior of a first embodiment.
Figure 2:
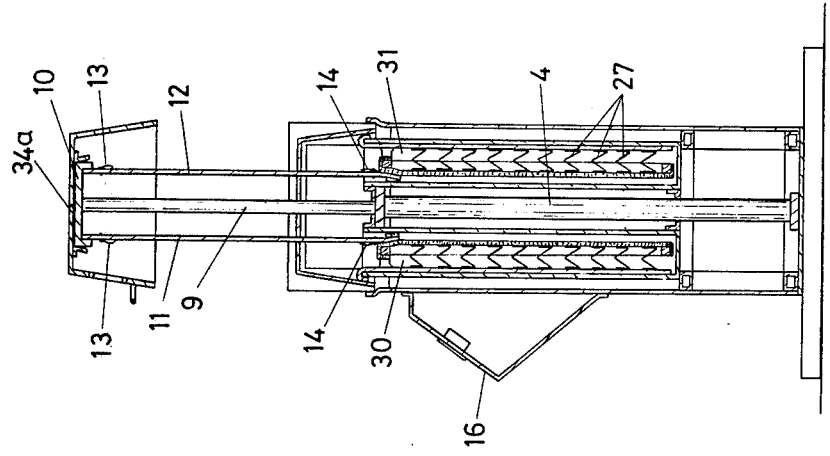
FIG. 2 is a cross-sectional view of the machine of the embodiment as shown in FIG. 1 along the lines 2—2.
Figure 3:
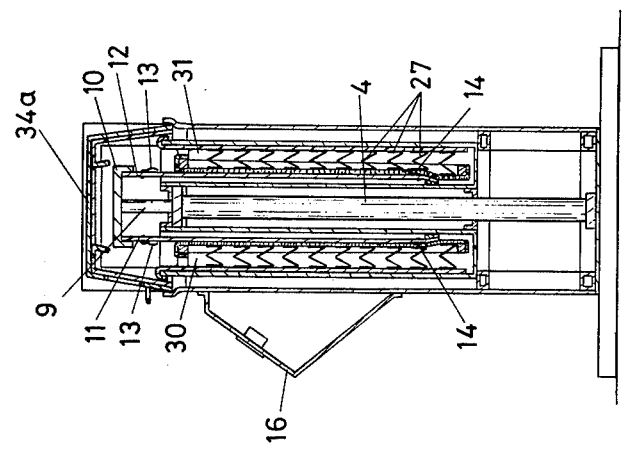
FIG. 3 is the same view as in FIG. 2 of the same preferred embodiment and the same cross-section except that the drive means lifting and dropping the plate holder is shown in a raised position as compared to FIG. 2 where this is shown in a lowermost position.
Figure 4:
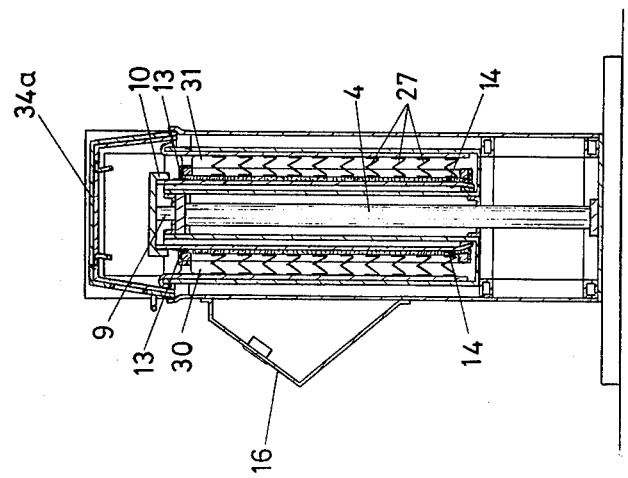
FIG. 4 is a cross-sectional view as in FIGS. 2 and 3 except on this occasion, the plate holder is shown in fully raised position in which location any plates attached thereto can be removed or relocated externally from any containment within the container.
Figure 6:
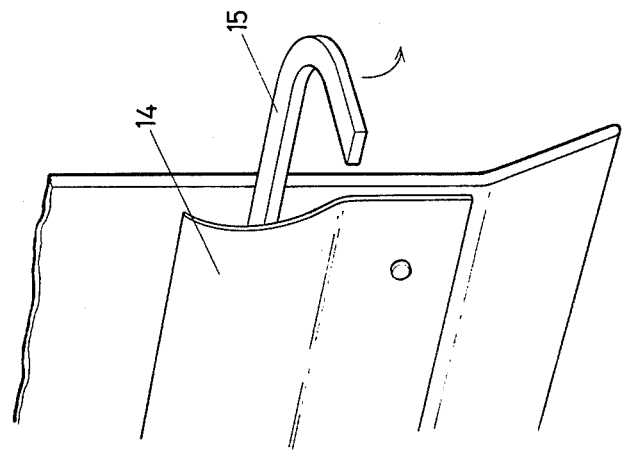
FIG. 6 is a perspective view showing one end and a lower corner portion of the plate holder and the means by which the plate clamp can be opened or closed.
Figure 5:
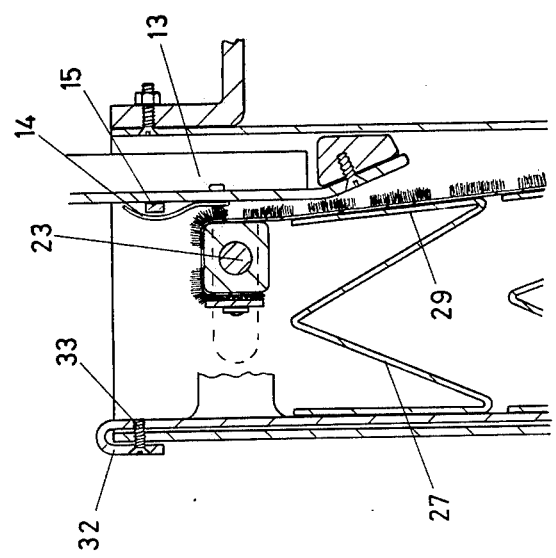
FIG. 5 is a side view in greater detail of an upper left hand portion of the container and the plate holder once again being according to the first preferred embodiment.

In operation, the action can be seen best by referring to FIGS. 2, 3, and 4 and interpreting these with respect to FIG. 14.

In FIG. 14, there is shown an upper trip valve 34 and a lower trip valve 35 which are activated by bearing against a trip arm 36 which is attached to the plate holder support arm 10.

These trip valves 34 and 35 act in conjunction with the control valve 8 so that when the control valve 8 is in the wash out position, this connects the pneumatic supply conduit through these valves and then to the supply conduit 7 supplying the pneumatic ram 4.

The action then is that these act as changeover valves trip valve 35 upon activation connecting the supply of fluid to conduit 7 and this causing the trip arm 36 to rise until it reaches trip valve 34 connection of which effects a change so that the supply pressure is closed and the conduit 7 is opened to atmosphere, allowing the pneumatic ram 4 to release and lower the piston rods 9 under its own weight.

This will continue of course until the trip arm 36 once again contacts trip valve 35 whereupon the supply is reconnected to hydraulic ram 4 via conduit 7.

The respective positions of the plate holders in each of the containers 30 and 31 are shown in FIGS. 2 and 3.

Upon the completion of the cycle as set by time 17, the air supply is closed off and an audible signal is given warning the operator that the cycle had finished.

When the operator wishes to inspect the plates held by the plate holders or wishes to change the plates, he operates the control valve 8 by locating this in the raised position and this will by-pass supply of either of the trip valves 34 and 35 and raise the piston rod 9 to the limit of its travel which then assumes the position as FIG. 4.

It is noted that the upper plate holder support arm 10 carries with it the cover 34.

This position then exposes both plate holders for access and out of any contact with solvents within the containers.

The means supplying pressure to the pliable sheet which of course includes the plush in this case can be varied according to a second and third preferred embodiment and according to the second embodiment, such means include a flexible sac as shown in FIGS. 11 and 12 at 37.

A frame backing 38 assists in ensuring that the sac 37 need not be of undue width and furthermore an extension to the sac 39 through a connecting conduit 40 provides that a head of fluid within the sac 37 can provide the necessary outward pressure.

It is of course implicit that the walls of the sac 37 are comprised of a material such as pliable plastic which while being resistant to any solvent action, can nonetheless hold the fluid pressure and be used to supply the pressure against the plush.

The container 41 also includes the plush holder 42 and the plate holder 43.

In FIG. 13 this is a third embodiment showing a sac 44 which this time is purely a closed sac and there is behind this a plate 45 which is subject to pressure by reason of spring 46 and 47 which therefore provides the uniform spreading of any pressure across the plush 48 against plate 49 in container 50.

Now referring to the first embodiment, it will be seen that the two containers 30 and 31 are each in adjacent location and of common height and generally in parallel one with respect to the other and are separated by a hydraulic or pneumatic ram in this case, a pneumatic ram, whereby the drive means connected through the mechanical linkage of the plate holder support arm 10 and the plate holder 11 or 12 provides an upward and downward wash out scouring motion.

It has been found that whereas previously it was considered of good value to have a rotary action, it has been found that provided there is an adequate change of direction so that the laying over of fibres in one direction is then countered by the movement in the other, so that in fact the fibres press against their formally laid over direction then there is an adequate wash out effect, the scouring effect being achieved by such reversal.

This in fact has vastly simplified the mechanical drive necessary and has indeed provided significant advantages in the apparatus as is seen.

In use, the containers, especially 30 and 31 will be seen to provide support for use with the plates during the wash out action being held generally vertical, and of course the orientation in itself need not be strictly vertical but can vary considerably perhaps as much as 20 to 30 degrees from the vertical, however, the main direction being vertical and of course having a very small upper surface area for exposure to the air, or perhaps more importantly, that all of the action occurs below the surface of the solvent but perhaps more importantly most of the mechanical action occurs deep below the surface, and therefore it is possible to provide a covering fluid which will not be substantially mixed into the surface of the solvent.

The invention can include the concept therefore of providing an additional blanket fluid above any solvent within a container for this purpose.

A significant feature is also the arrangement of two containers, so that at any one time, either twice the cleaning action available from one container alone, is available, or one of the containers can have one solvent and perhaps a different solvent in the other container so that different plates can be processed at the same time.

The application to which the machine can be put, while being specifically developed for photopolymer flat plates, would not be necessarily limited to such application and the advantages from the features described can be applied to a somewhat wider scope.

As illustrative of the extension of application, it is considered that silk screened photo stencils, wrap around gravure plates, rotary letter press polymer plates, offset plates, resists for photo engravers, dry offset plate, rubber stamps, non-silver films for graphic arts work and in fact any application of similar type could be involved.

Plates such as those presently sold in the Commonwealth of Australia under the Trade Marks "Torelief Toyobo, Jet Letterpress, Runaflex, Cyrel, Flex-light, Jet Flexo, Napp, Nyloprint, Dycril and Aquamer plates", give better results in relation to wash out that has hitherto been possible with previous machines.

I claim:

1. A flat plate wash out apparatus of a type including a container for holding solvent fluid, a holder adapted to hold, within the container, a flat plate to be washed out with face portions to be selectively removed under the joint action of a solvent within the container and a mechanical scouring action, brush means held adjacent the flat plate face location, and means adapted to provide relative movement between flat plate held within the container and the brush means to effect the said scouring action, the apparatus being characterized according to this invention in that the brush means include a pliable sheet located behind brush out fingers projecting toward the face of any flat plate when held appropriately in the holder in solvent in the container, and distributed pressure means behind the said pliable sheet to provide substantially uniform pressure against the pliable sheet whereby to urge such fingers against the face of any such flat plate.

2. A flat plate wash out apparatus as in claim 1 in which the apparatus is further characterized in that the holder is adapted to hold a flat plate with the plate in a vertical or substantially vertical orientation while being washed out in solvent in the container.

3. A flat plate wash out apparatus as in either of claims 1 or 2 in which the apparatus is further characterized in that drive means to effect the mechanical scouring action are coupled to the holder in such a way as to provide a to and fro relative movement between any held flat plate and the brush means.

4. A flat plate wash out apparatus as in claim 2 in which the apparatus is further characterized in that there are two containers for holding solvent fluid and each includes means as hitherto characterized whereby to hold a flat plate within solvent fluid within the container and drive means to effect relative motion between any such held flat plate and brush means, and the drive means being characterized by including a common pneumatic or hydraulic ram to effect such relative motion in each of the containers.

5. A flat plate wash out apparatus of a type which includes a container for holding solvent fluid, and drive means to effect a relative wash out movement between a plate held in a holder and brush means while the plate is within solvent fluid held in the container, the apparatus being characterized according to this invention in that the holder is adapted to hold any flat plate in a position in solvent fluid in the container with the plane of the plate in a vertical or substantially vertical orientation while the plate is being subjected to wash out action from the brush means which is disposed in adjacent relationship thereto to effect wash out relative movement.

6. A flat plate wash out apparatus as in claim 5 in which the apparatus is further characterized in that drive means effecting said relative wash out movement include a pneumatic or hydraulic ram arranged and constructed so that a to and fro action is provided to effect the wash out movement.

7. A flat plate wash out apparatus as in claim 6 wherein the apparatus is further characterized in that there are two containers for holding solvent fluid, and each container includes means as hitherto characterized including a holder for holding the flat plate and brush means, the containers being in an adjacent location one with respect to the other and each being coupled to drive means which include a common driving pneumatic or hydraulic ram.

8. A flat plate wash out apparatus as in either of claims 6 or 7 in which the apparatus is further characterized in that the brush means include a pliable sheet between outwardly projecting brush out fingers, and there are distributed pressure means behind the said pliable sheet arranged to effect pressure against the pliable sheet and in turn to cause the brush out fingers to act against any plate held by the holder.

9. A flat plate wash out apparatus as in claim 8 in which the apparatus is further characterized in that the pliable sheet is retained so that it is under tension.

10. A flat plate wash out apparatus as in claim 8 in which the apparatus is further characterized in that the distributed pressure means behind the pliable sheet comprises a plurality of separate springs arranged so that on one side each bears against a portion of the container, and, on a further side, bear each independently against the pliable sheet.

11. A flat plate wash out apparatus according to claim 8 in which the pliable sheet together with the outwardly projecting fingers are together constituted by being respective portions of plush.

12. A flat plate wash out apparatus as in claim 8 in which the apparatus is further characterized in that the distributor pressure means include a sac having fluid therein under pressure whereby to exert pressure against the pliable sheet.

13. A flat plate wash out apparatus as in either of Claims 6 or 7 in which the apparatus is further characterized in that the drive means include a rod operable in a raised mode to effect the lifting of the holder out from a position within the container to assist in re-location of any flat plates attached thereto for washing out or removal purposes.

* * * * *